(12) United States Patent
Hsieh

(10) Patent No.: US 8,569,780 B2
(45) Date of Patent: Oct. 29, 2013

(54) SEMICONDUCTOR POWER DEVICE WITH EMBEDDED DIODES AND RESISTORS USING REDUCED MASK PROCESSES

(75) Inventor: Fu-Yuan Hsieh, New Taipei (TW)

(73) Assignee: Force MOS Technology Co., Ltd., New Taipei (TW)

( * ) Notice: Subject to any disclaimer, the term of this patent is extended or adjusted under 35 U.S.C. 154(b) by 44 days.

(21) Appl. No.: 13/246,357

(22) Filed: Sep. 27, 2011

(65) Prior Publication Data

US 2013/0075809 A1    Mar. 28, 2013

(51) Int. Cl.
*H01L 33/00* (2010.01)

(52) U.S. Cl.
USPC ............. 257/98; 257/173; 257/302; 257/139; 257/328; 257/356; 257/577; 257/330; 257/334; 361/56

(58) Field of Classification Search
USPC ......... 257/328, 358, 360, 363, 379, 516, 577, 257/173, E27.016, E27.02, E27.031, 257/E29.326; 438/212, 268, 128, 237; 361/56
See application file for complete search history.

(56) References Cited

U.S. PATENT DOCUMENTS

| | | | |
|---|---|---|---|
| 6,657,255 B2 * | 12/2003 | Hshieh et al. | 257/330 |
| 7,476,931 B2 * | 1/2009 | Schmidt | 257/328 |
| 7,781,826 B2 * | 8/2010 | Mallikararjunaswamy et al. | 257/328 |
| 7,816,720 B1 * | 10/2010 | Hsieh | 257/302 |
| 8,004,009 B2 * | 8/2011 | Hsieh | 257/173 |
| 8,338,915 B2 * | 12/2012 | Mallikararjunaswamy et al. | 257/577 |
| 2006/0091457 A1 * | 5/2006 | Kobayashi | 257/330 |
| 2007/0138542 A1 * | 6/2007 | Schmidt | 257/328 |
| 2007/0176239 A1 * | 8/2007 | Hshieh | 257/355 |
| 2008/0121988 A1 * | 5/2008 | Mallikararjunaswamy et al. | 257/328 |
| 2008/0258224 A1 * | 10/2008 | Hshieh | 257/356 |
| 2008/0290367 A1 * | 11/2008 | Su et al. | 257/173 |
| 2009/0039432 A1 * | 2/2009 | Nishimura et al. | 257/362 |
| 2009/0219657 A1 * | 9/2009 | Hshieh | 361/56 |
| 2010/0090270 A1 * | 4/2010 | Hsieh | 257/328 |
| 2010/0314682 A1 * | 12/2010 | Yilmaz et al. | 257/328 |
| 2010/0314716 A1 * | 12/2010 | Mallikararjunaswamy et al. | 257/577 |
| 2011/0266593 A1 * | 11/2011 | Hsieh | 257/139 |
| 2012/0032261 A1 * | 2/2012 | Hsieh | 257/334 |
| 2012/0199875 A1 * | 8/2012 | Bhalla et al. | 257/134 |
| 2013/0001684 A1 * | 1/2013 | Hsieh | 257/334 |

* cited by examiner

*Primary Examiner* — Fernando L Toledo
*Assistant Examiner* — Mohammed Shamsuzzaman
(74) *Attorney, Agent, or Firm* — Bacon & Thomas, PLLC

(57) ABSTRACT

A trench semiconductor power device integrated with a Gate-Source and a Gate-Drain clamp diodes without using source mask is disclosed, wherein a plurality source regions of a first conductivity type of the trench semiconductor device and multiple doped regions of the first conductivity type of the clamp diodes are formed simultaneously through contact open areas defined by a contact mask.

5 Claims, 19 Drawing Sheets

SEMICONDUCTOR POWER DEVICE WITH EMBEDDED DIODES AND RESISTORS USING REDUCED MASK PROCESSES

FIELD OF THE INVENTION

This invention relates generally to the cell structure, device configuration and fabrication process of semiconductor power devices. More particularly, this invention relates to an improved cell configuration to manufacture a trench semiconductor power device with embedded diodes and resistor using reduced mask process.

BACKGROUND OF THE INVENTION

Conventional technologies for manufacturing trench semiconductor power devices are continuously challenged to further reduce the manufacturing cost by reducing the number of masks applied in the manufacturing process. For example, for a trench MOSFET (Metal Oxide Semiconductor Field Effect Transistor) integrated with Zener diodes for ESD (Electronic Static Discharge) protection and for avalanche capability improvement, simplifying the manufacturing process and cutting down the manufacturing cost without degrading performance is mainly required by device designing and manufacturing.

In U.S. Pat. No. 8,004,009 which has same inventor name and assignee name as the present patent application, a trench MOSFET with Zener diodes for providing ESD protection is disclosed, please refer to FIG. 1A and FIG. 1B for side cross-sectional views showing some of the process steps to make the same. In FIG. 1A, a photo resist 101 is employed as a source mask followed by an Arsenic or Phosphorus ion implantation to form n+ source regions 102 for an N-channel trench MOSFET and n+ doped regions 103 for the Zener diodes which is padded by a thick insulation layer 107 overlying a Nitride layer 108 formed onto a thin oxide layer 110. In FIG. 1B, after removing away the source mask, a contact interlayer 104 is deposited covering a top surface of the thin oxide layer 110, an outer surface of a structure composed of the Zener diodes, the thick insulation layer 107 and the Nitride layer 108. Then, onto the contact interlayer 104, a contact mask (not shown) is applied to open a plurality of contact trenches 105 for formation of trenched contacts for the Zener diodes and for the N-channel trench MOSFET. Afterwards, p+ body contact regions 106 are formed wrapping bottoms of the contact trenches 105 underneath n+ source regions 111 in P body regions 112 of the N-channel trench MOSFET.

FIG. 1C is a top view of the N-channel trench MOSFET integrated with the Zener diodes of the prior art discussed above, which shows that a gate metal is deposited crossing over the Zener diodes (underneath the gate metal) to connect to trenched gate contacts, for example formed in the contact trench 105 extending into a trenched gate as shown in FIG. 1B.

The invention of U.S. Pat. No. 8,004,009 has to use both a source mask and a contact mask. The source mask is used to defined source regions of trench MOSFET and n+ regions on the Zener diode while the contact mask is used to define the trenched contacts for the gate metal and a source metal connections. Each of the n+ source region 111 has a same doping concentration from a channel region to an adjacent contact trenches 105 penetrating through the n+ source region 111 at a same distance from a top surface of an N epitaxial layer 120 wherein the prior art is formed, and has a same source junction depth along the top surface of the N epitaxial layer 120 from the channel region to the adjacent contact trench 105. Moreover, the manufacturing process is complicated due to additional nitride deposition and etching processes.

Therefore, there is still a need in the art of the semiconductor power device integrated with a clamp diode, to provide a novel cell structure, device configuration and fabrication process that would further reduce the number of masks applied in the manufacturing process without additional costs and minimize the number of the manufacturing process steps.

SUMMARY OF THE INVENTION

It is therefore an aspect of the present invention to provide a trench semiconductor power device so that the source mask is saved by using contact mask to simultaneously define source regions of trench MOSFET and n+ regions on the Zener diode, and trenched source-body and trenched diode contacts as well for cost reduction. According to the present invention, there is provided a semiconductor power device comprising: a plurality of first type trenched gates being spaced from each other and formed in a semiconductor silicon layer; a clamp diode formed onto the semiconductor silicon layer and comprising: multiple back to back Zener diodes with alternating doped regions of a first conductivity type next to doped regions of a second conductivity type, which is complementary to the first conductivity type; and a plurality of trenched diode contacts extending into all the doped regions of the first conductivity type of the clamp diode, each of the trenched diode contacts being filled with a contact metal plug. The semiconductor power device can be formed as a trench MOSFET, and the semiconductor silicon layer comprises an epitaxial layer of the first conductivity type onto a substrate of the first conductivity type. The semiconductor power device can also be formed as a trench IGBT (Insulated Gate Bipolar Transistor), wherein the semiconductor silicon layer comprises a first epitaxial layer of the first conductivity, and a second epitaxial layer of the first conductivity type having a higher doping concentration than the first epitaxial layer, extending over a heavily doped substrate of the second conductivity type.

It is therefore another aspect of the present invention to provide a trenched resistor formed in the semiconductor silicon layer and partially below the clamp diode to connect a first gate metal layer as gate metal pad for gate metal bonding at one side of the trenched resistor and connect a second gate metal layer at another side for gate connection, wherein the trenched resistor comprises a doped poly-silicon layer, which is padded by a resistor insulation layer, filled into a wide gate trench. In some preferred embodiments, the resistor insulation layer can be implemented to have a thickness along bottoms of the wide gate trench not greater than sidewalls for the trenched resistor. In another preferred embodiments, the resistor insulation layer also can be implemented to have a thickness along the bottoms greater than along sidewalls of the wide gate trench for the trenched resistor. The trenched resistor is simultaneously and respectively connected to the first gate metal layer and the second gate metal layer of the semiconductor power device, for example via a trenched metal contact filled with the contact metal plug, wherein said the gate metal layer and the second gate metal layer are separately located. The second gate metal layer is further connected to a second type trenched gate for gate connection, which is formed in the semiconductor silicon layer and having a same gate structure as the first type trenched gates but wider trenched gate width, via a trenched gate contact which is filled with the contact metal plug and extending into the second type trenched gate.

It is therefore another aspect of the present invention to form source regions of the first conductivity type for the semiconductor power device without using a source mask. The source regions flanking the first type trenched gates are formed in body regions of the second conductivity type encompassed in the semiconductor silicon layer, and are connected to a source metal layer via a trenched source-body contact, which is filled with the contact metal plug penetrating through the source regions and extending into the body regions between a pair of the first type trenched gates. As no source mask is employed in fabrication process, the source regions are diffused laterally from trenched source-body contacts between the pair of first type trenched gates, to adjacent channel regions nearby as disclosed in U.S. Pat. No. 7,816,720 which has same inventor and assignee names as this invention. Therefore, the source regions have a doping concentration along trench sidewalls of the trenched source-body contact higher than along the adjacent channel region near the first type trenched gate at a same distance from a top surface of the semiconductor silicon layer, and the source region have a junction depth along the trench sidewalls of the trenched source-body contact greater than along the adjacent channel region, and the source region have a doping profile of a Gaussian-distribution along the top surface of the semiconductor silicon layer from the trench sidewalls of the trenched source-body contact to the adjacent channel region.

It is therefore another aspect of the present invention that the first type trenched gates can be implemented to have shielded gate structure in some preferred embodiments. The first type trenched gates having shielded gate structure comprise a shielded electrode in a lower portion and a gate electrode in an upper portion of the first type trenched gates, wherein the shielded electrode is insulated from the gate electrode by an inter-insulation layer. Meanwhile, sidewalls and a bottom of the shielded electrode is surrounded by a first gate insulation layer, sidewalls of the gate electrode is surrounded by a second gate insulation layer, wherein the first gate insulation layer has a greater thickness than the second gate insulation layer. In the case of shielded gate structure, the semiconductor power device further comprises a fourth type trenched gate having the same single gate structure for shielded electrode connection. The fourth type trenched gate is filled with a single shielded electrode padded by the first gate insulation layer and is connected to a source metal layer via a trenched shielded electrode contact filled with the contact metal plug. In other preferred embodiments, the first type trenched gates can be implemented to have single gate structure which comprises a single electrode padded by a gate insulation layer, wherein the gate insulation layer can be formed to have a same thickness along sidewalls and a bottom of the single electrode, and can also be formed to have a greater thickness along the bottom than along the sidewalls of the single electrode for gate charge reduction.

Some preferred embodiments include one or more detail features as followed: the semiconductor power device further comprises a termination area comprising multiple third type trenched gates in the semiconductor silicon layer and being spaced apart from each other, wherein the third type trenched gates have a same gate structure as the first type trenched gates and have floating voltage to function as trenched floating rings in the termination area for maintaining the breakdown voltage for the semiconductor power device; the Gate-Source clamp diode is formed to be connected to a source metal layer on one side (anode side) and to a first gate metal layer on another side (cathode side) to act as an ESD clamp diode between a source region and a gate region of the semiconductor power device; a Gate-Drain clamp diode is formed to be connected to a first gate metal layer on one side (anode side) and to a first drain metal layer on another side (cathode side) in the termination area for improvement of avalanche capability between a gate region and a drain region of the semiconductor power device wherein a second drain region is formed on backside of the semiconductor silicon layer; the first conductivity type is N type and the second conductivity type is P type or the first conductivity type is P type and the first conductivity type is N type; The semiconductor power device is integrated with a Gate-Source clamp diode or a Gate-Drain clamp diode, or both the Gate-Source and Gate-Drain clamp diodes in a single chip.

This invention further disclosed a method of manufacturing a trench semiconductor power device comprising the steps of: etching a wide gate trench in a semiconductor silicon layer and filling the wide gate trench with a doped polysilicon layer onto a resistor insulation layer to form a trenched resistor; forming a clamp diode comprising multiple back to back Zener diodes with alternating doped regions of a first conductivity type next to doped regions of a second conductivity type, which is complementary to the first conductivity type, onto the semiconductor silicon layer and above the trenched resistor; forming a plurality of trenched diode contacts filled with contact metal plugs extending into all the doped regions of the first conductivity type of the clamp diode; connecting the trenched resistor to a first gate metal layer and a second gate metal layer, which are separately located, of the semiconductor power device. Before etching the wide gate trench, the method for making a trench MOSFET, for example, further comprises forming an epitaxial layer lightly doped with the first conductivity type onto a substrate heavily doped with the first conductivity type. Or the method for making a trench IGBT, for example, further comprises forming an epitaxial layer lightly doped with the first conductivity type over a buffer layer, which is also doped with the first conductivity type but has a higher doping concentration than the epitaxial layer, onto a substrate heavily doped with the second conductivity type. The method further comprises forming source regions of the first conductivity type in body regions of the second conductivity type without using a source mask.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, which forms a part hereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 2A:
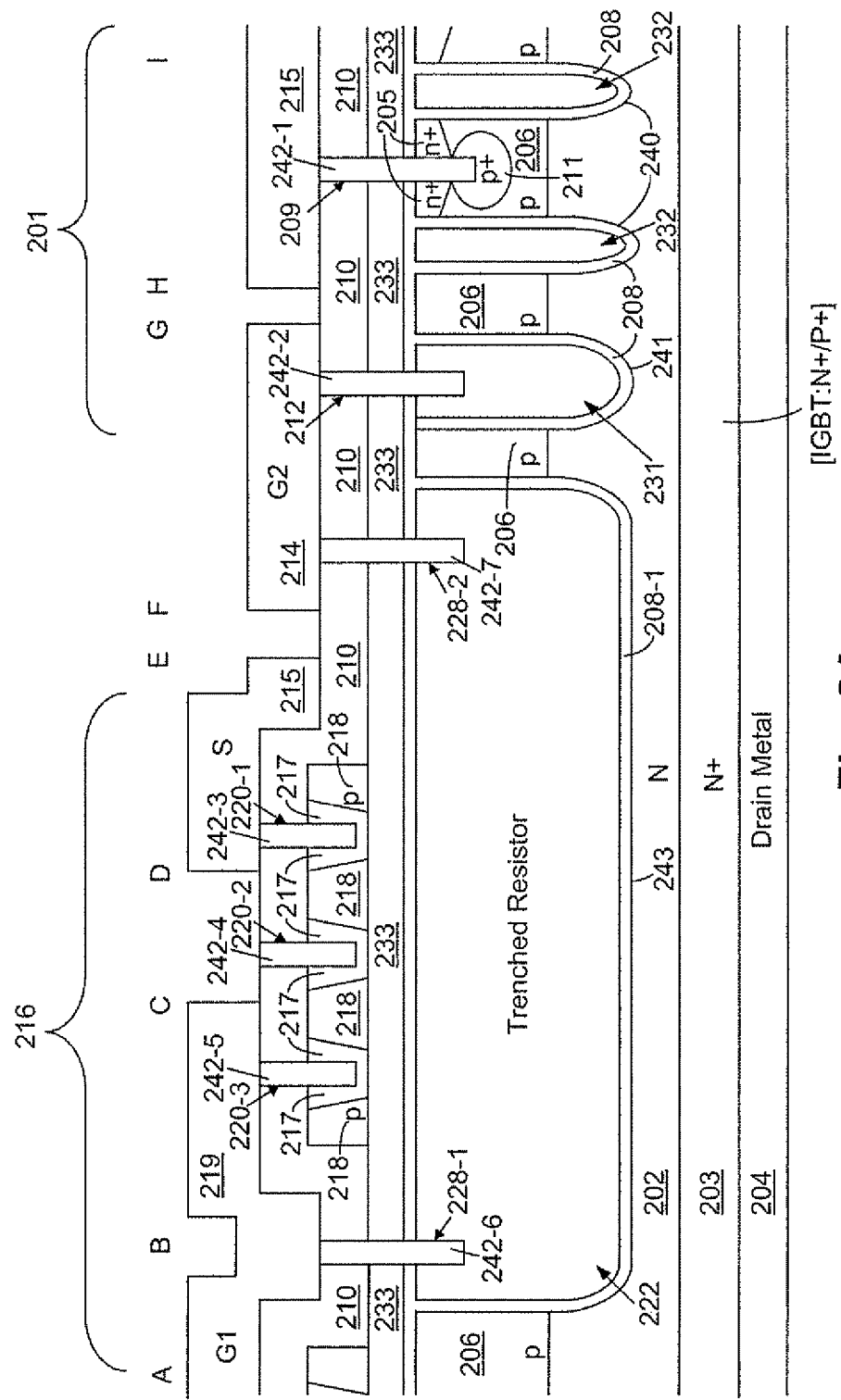
FIG. 2A is a cross-section view of a preferred embodiment for a semiconductor power device according to the present invention.
Figure 2B:
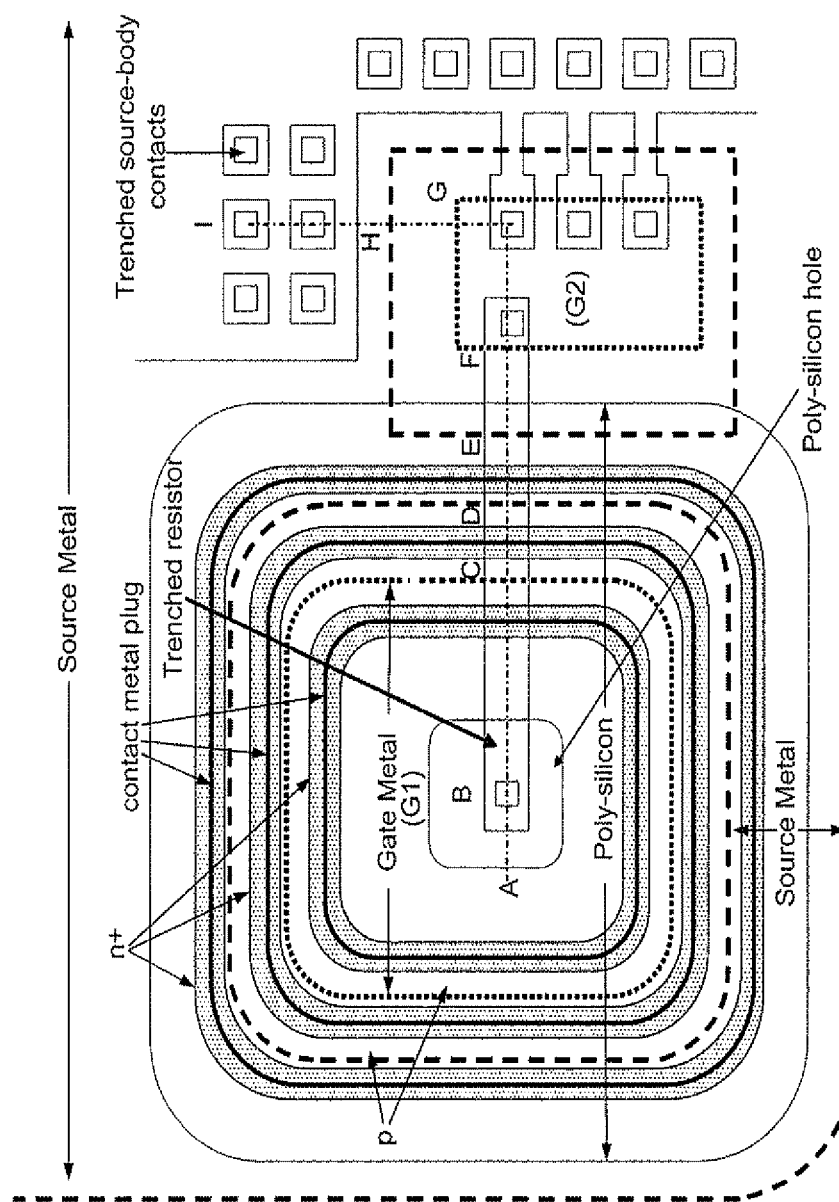
FIG. 2B is a top view of a preferred embodiment for a semiconductor power device according to the present invention.

Please refer to FIG. 2A for an A-B-C-D-E-F-G-H-I cross sectional view of FIG. 2B, wherein a preferred embodiment of an N-channel trench semiconductor power device is shown comprising an N-channel trench MOSFET 201 integrated with a Gate-Source clamp diode 216 between a gate region and a source region for ESD prevention. The N-channel trench MOSFET 201 is formed in a semiconductor silicon layer which can be implemented by comprising an N epitaxial layer 202 above a heavily doped N+ substrate 203 coated with a back metal of Ti/Ni/Ag on a bottom side as a drain metal 204. In the trench MOSFET 201, a plurality of first type trenched gates 232 having a single gate structure are formed spaced apart by p body regions 206 and extending into the N epitaxial layer 202. Each of the first type trenched gates 232 comprises a single electrode padded by a gate insulation layer 208, for example, gate oxide layer, in a first gate trench 204, wherein the gate insulation layer 208 has a same thickness along sidewalls and a bottom of the single electrode or has a thickness along the sidewalls greater than the bottom. N+ source regions 205 are encompassed in the p body regions 206 between a pair of the first type trenched gates 232. A trenched source-body contact 209 filled with a contact metal plug 242-1, for example, a tungsten plug padded by a barrier layer of Ti/TiN or Co/TiN or Ta/TiN, is implemented through a contact interlayer 210, a thick insulation layer 233, the n+ source regions 205 and extending into the p body regions 206 between the pair of the first type trenched gates 232 to connect the p body regions 206 and the n+ source regions 205 to a source metal layer 215 onto the contact interlayer 210. The n+ source regions 205 have a doping concentration along trench sidewalls of the trenched source-body contact 209 higher than along an adjacent channel region near the first type trenched gate 232 at a same distance from a top surface of the N epitaxial layer 202, and have a junction depth along the trench sidewalls of the trenched source-body contact 209 greater than along the adjacent channel region, and the n+ source regions 205 have a doping profile of a Gaussian-distribution along the top surface of the N epitaxial layer 202 from the trench sidewalls of the trenched source-body contact 209 to the adjacent channel region. The doping concentration and junction depth profile of the n+ source regions 205 according to the present invention would result in better avalanche capability (The U.S. Pat. No. 7,816,720). A p+ body contact region 211 having a higher doping concentration than the p body regions 206 is formed surrounding a bottom of the trenched source-body contact 209 to reduce the contact resistance between the p body regions 206 and the contact metal plug 242-1 in the trenched source-body contact 209. The trench MOSFET 201 further comprises a second type trenched gate 231 formed in the N epitaxial layer 202 and having the same single gate structure as the first type trenched gates. The second type trenched gate 231, which comprises the single electrode padded by the gate insulation layer 208 in a second type gate trench 241, has a greater trench width than the first type trenched gates 232. A trenched gate contact 212 filled with the contact metal plug 242-2, which is the same as the contact metal plug 241-1, is implemented through the contact interlayer 210, the thick insulation layer 233 and extends into the second type trenched gate 231 to connect the second type trenched gate 231 to a second gate metal layer (G2, as illustrated) 214 for gate connection. The Gate-Source clamp diode 216 for providing an ESD protection comprises multiple back to back Zener diodes with alternating n+ doped regions 217 next to p doped regions 218, and further comprises trenched diode contacts (220-1, 220-2 and 220-3) filled with the contact metal plugs (242-3, 242-4, and 242-5, which are the same as the contact metal plugs 242-1 and 242-2) extending into all the n+ regions 217, which is different from the prior art comprising trenched diode contacts only on two sides (an anode side and a cathode side) of the clamp diode as shown in FIG. 18. The trenched diode contacts 220-3 on one side (the cathode side) of the clamp diode 216 is connected to a first gate metal layer (G1, as illustrated) 219 and the trenched diode contact 220-1 on another side (the anode side) of the clamp diode 216 is connected to the source metal layer 215 which is connected to the n+ source regions 205 of the trench MOSFET 201. The n+ doped regions 217 are formed at the same fabricating step as the n+ source regions 205, therefore have a similar diffusion shape to the n+ source regions 205. In order to connect the first gate metal layer 219 and the second gate metal layer 214 together while not shorted to the contact metal plug 242-4 in the trenched diode contact 220-2 which is not covered by metal layers, a trenched resistor 222 is invented in the N epitaxial layer 202 partially disposed below the clamp diode 216 according to the present invention. The trenched resistor is formed by filling a doped poly-silicon layer padded by a resistor insulation layer 208-1 in a wide gate trench 243, the trenched resistor 222 is simultaneously connected to both the first gate meal layer 219 and the second gate metal layer 214 via trenched metal contacts (228-1 and 228-2) filled with the contact metal plugs (242-6 and 242-7, which are the same as the contact metal plugs 242-1) and extending into the doped poly-silicon layer of the trenched resistor 222. The trenched resistor 222 and the second type trenched gate 231 have a greater trench width than the first type trenched gates 232.

Figure 1A:
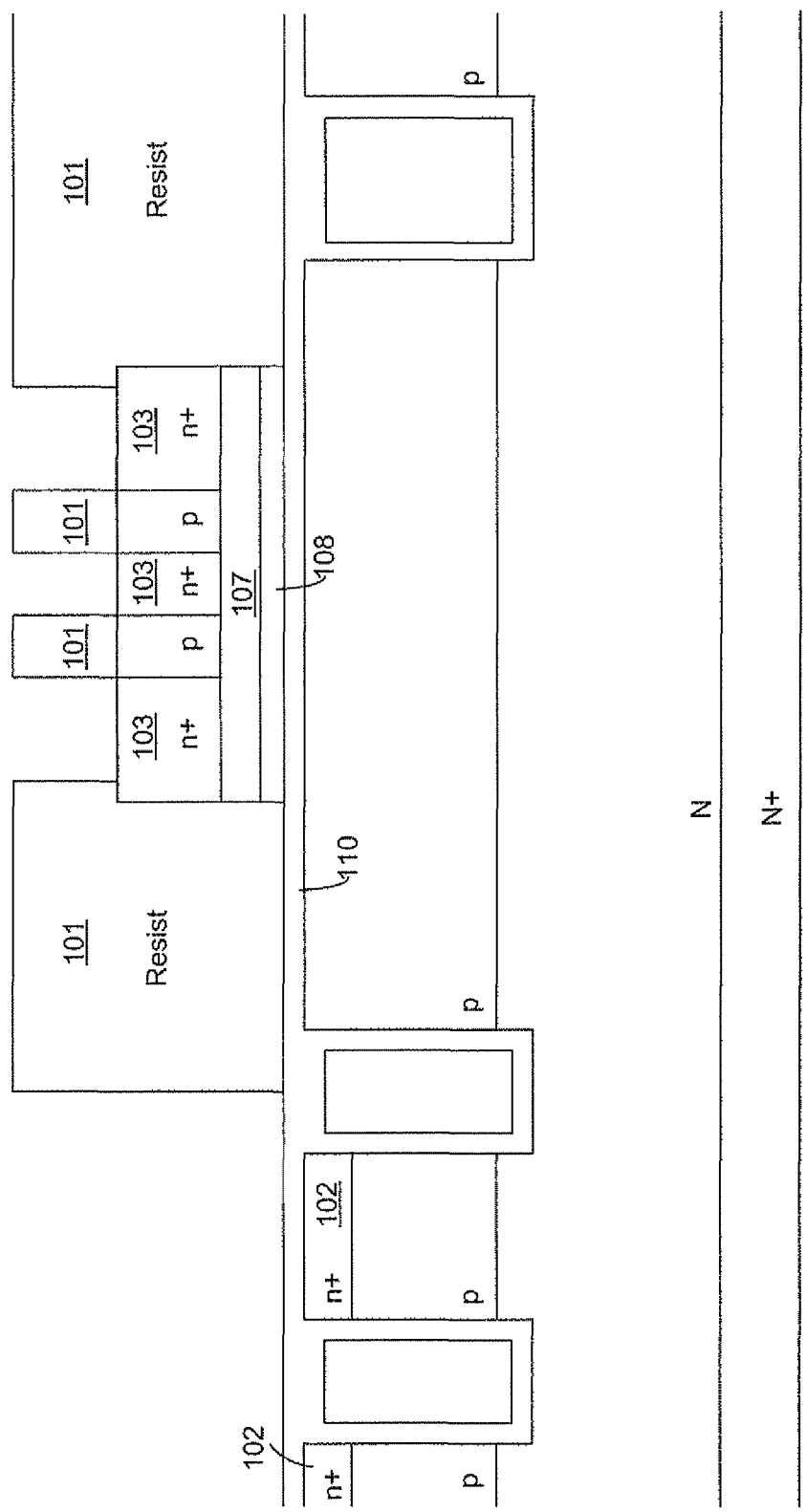
FIG. 1A is a side cross-sectional view of a prior art for showing the formation of a source region by employing a source mask.
Figure 1B:
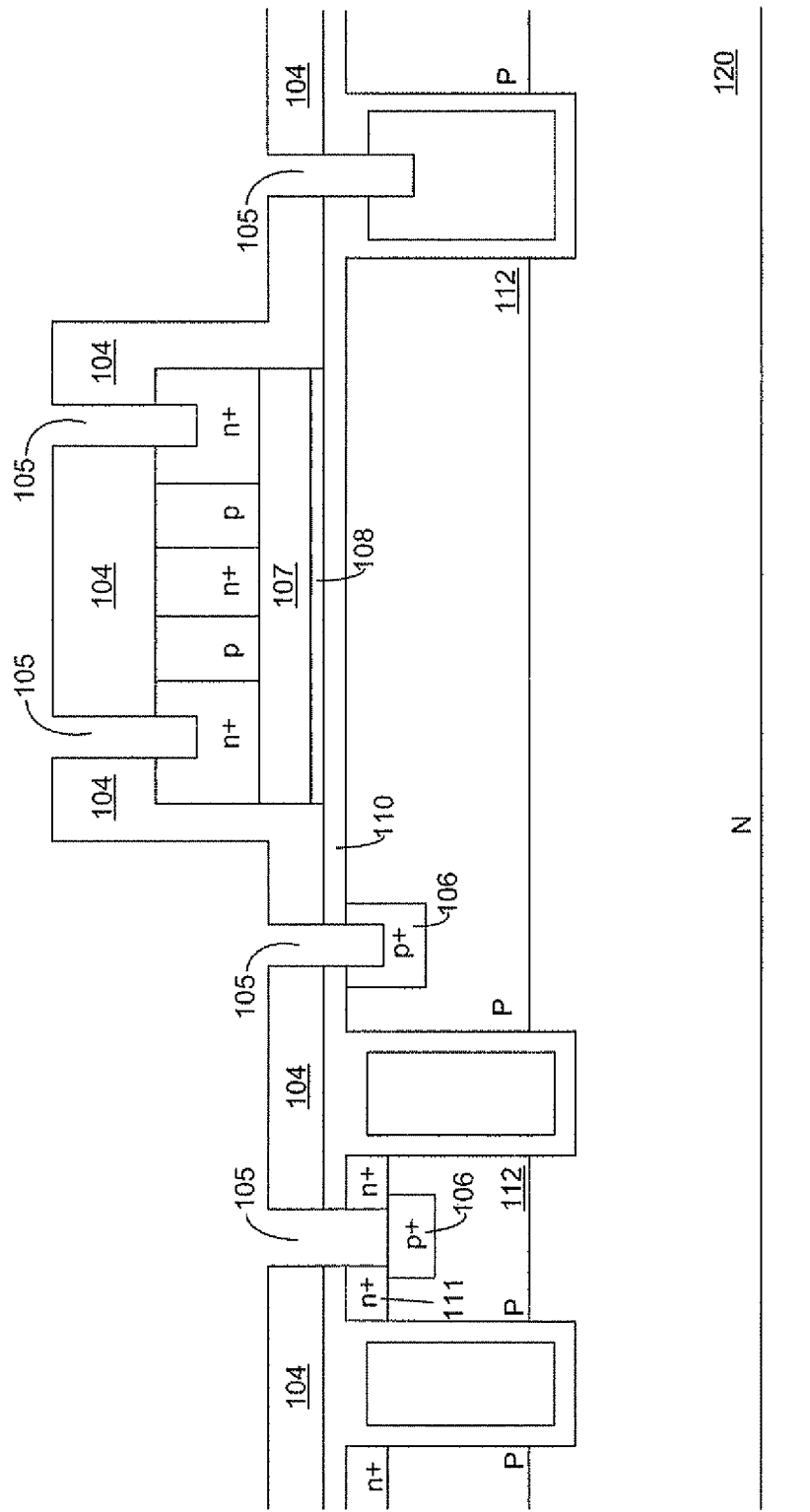
FIG. 1B is a side cross-sectional view of the prior art for showing the formation of contact trenches by employing a contact mask.
Figure 1C:
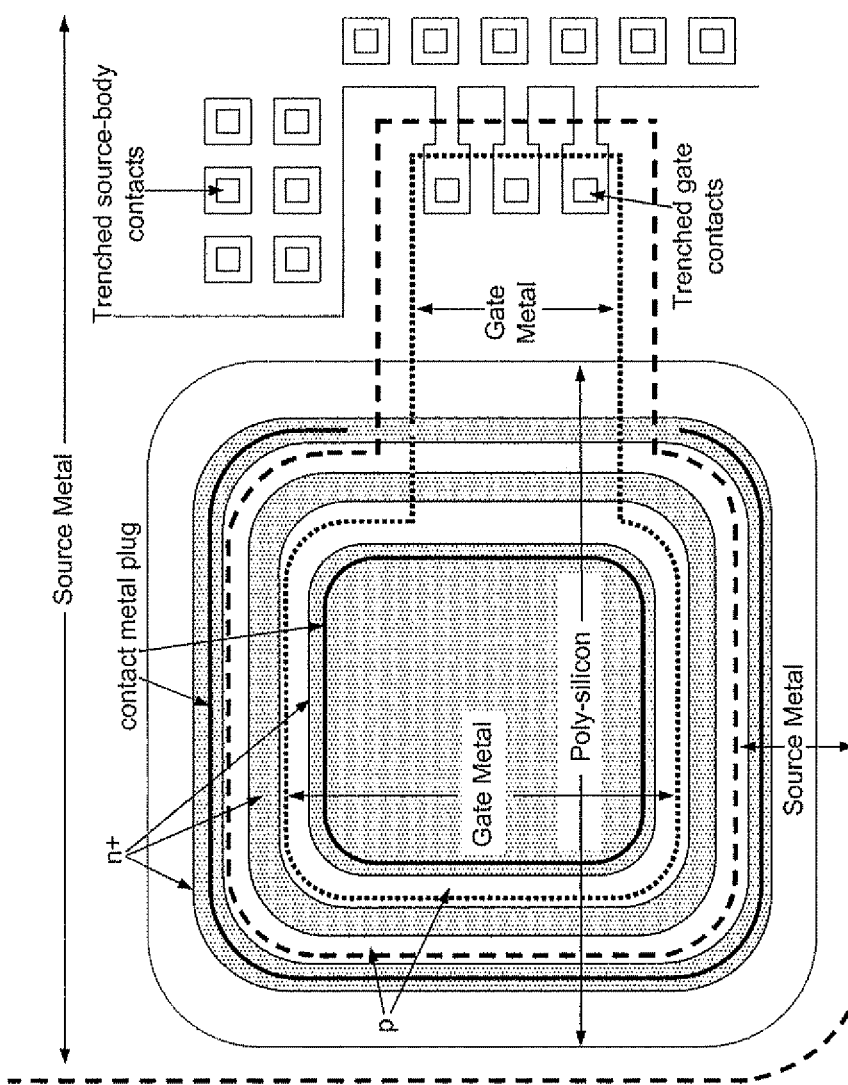
FIG. 1C is a top view of a conventional trench MOSFET with Zener diodes according to the prior art.

FIG. 2B is a top view of the preferred embodiment of this invention. As shown in FIG. 2B, there is a contact metal plug in each of n+ doped regions of the clamp diode, which is different from FIG. 1C. FIG. 2B also indicates that, unlike FIG. 1C, the first gate metal layer (G1) and the second gate metal layer G2 in FIG. 2B are two metal layers separately located which were connected together by a trenched resistor underneath. Moreover, the Gate-Source clamp diode comprising multiple back to back Zener diode, is formed on a peripheral region of a poly-silicon layer having a poly-silicon hole opened within the poly-silicon layer for connection of the first gate metal layer to the trenched resistor.

Figure 2C:
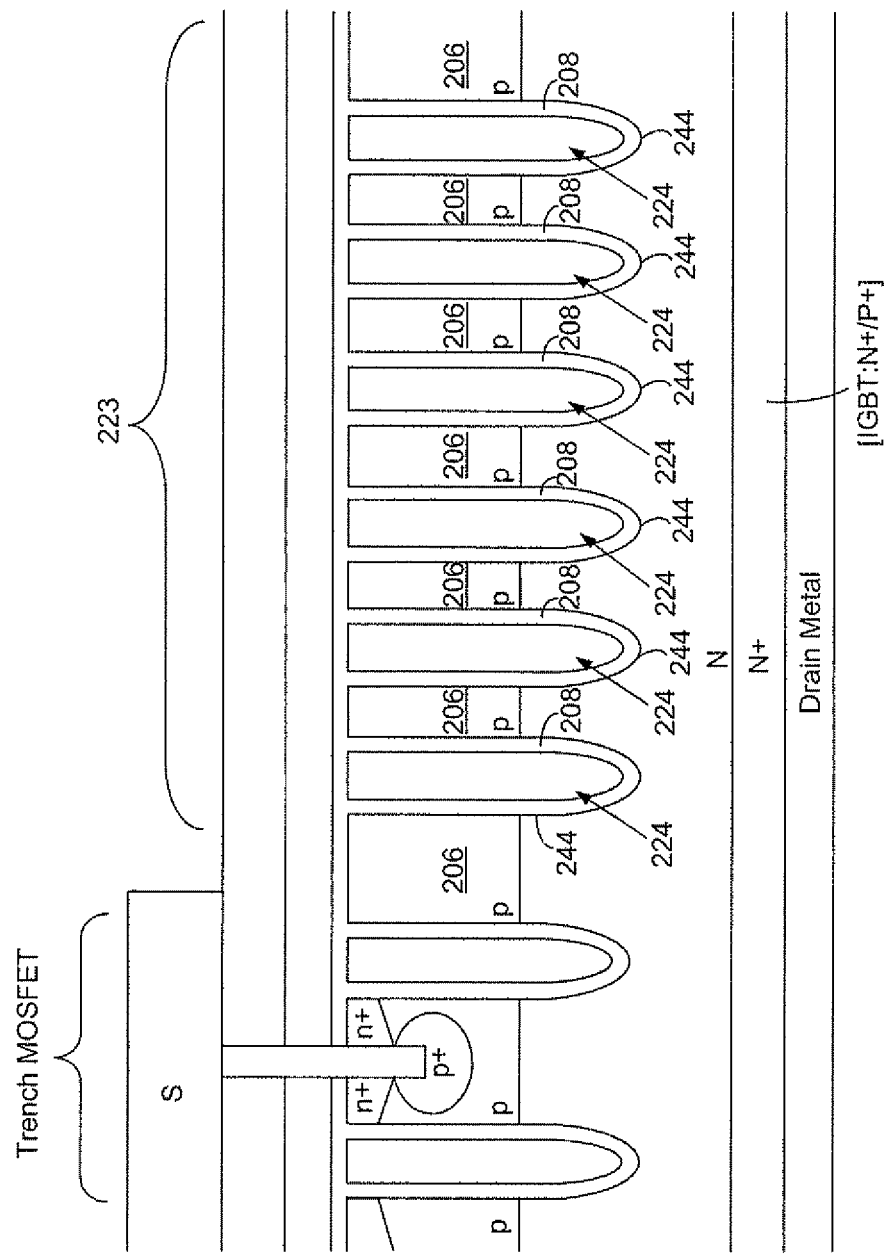
FIG. 2C is a cross-section view showing a termination area of a preferred embodiment for a semiconductor power device according to the present invention.

FIG. 2C shows the trench MOSFET of FIG. 2A with a termination area 223. The termination area 223 comprises multiple third type trenched gates 224 being spaced apart by the p body regions 206, wherein the third type trenched gates 224 have floating voltage to function as trenched floating gates in the termination area 223 for maintaining the breakdown voltage of the trench MOSFET. Each of the third type trenched gates 224 having the same single gate structure as the first type trenched gates 232 as shown in FIG. 2A comprises the single electrode padded by the gate insulation layer 208 formed in a third type gate trench 244, wherein the gate insulation layer 208 has a same thickness along the sidewalls and the bottom of the single electrode.

Figure 3A:
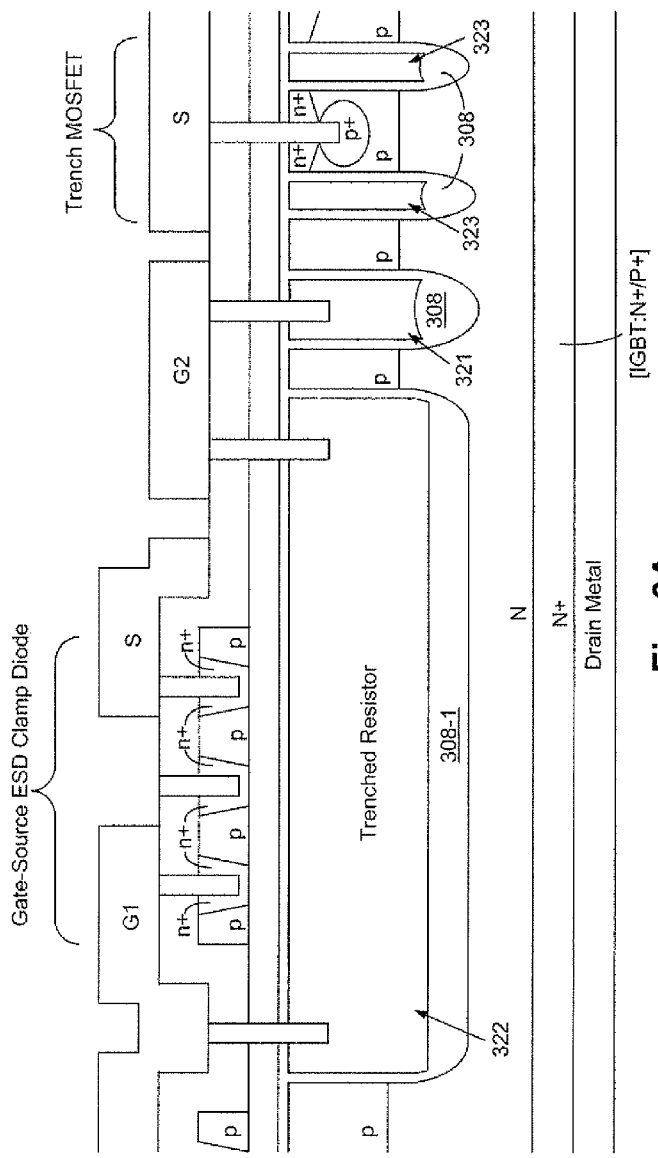
FIG. 3A is a cross-section view of another preferred embodiment for a semiconductor power device according to the present invention.

Please refer to FIG. 3A for another preferred embodiment of this invention. The structure of FIG. 3A is similar to the structure of FIG. 2A except that, in FIG. 3A, the gate insulation layer 308 has a greater thickness along the bottoms than along sidewalks of the first type trenched gates 323 and the second type trenched gates 321, and the resistor insulation layer 308-1 has a greater thickness along the bottom than along the sidewalks of the trenched resistor 322.

Figure 3B:
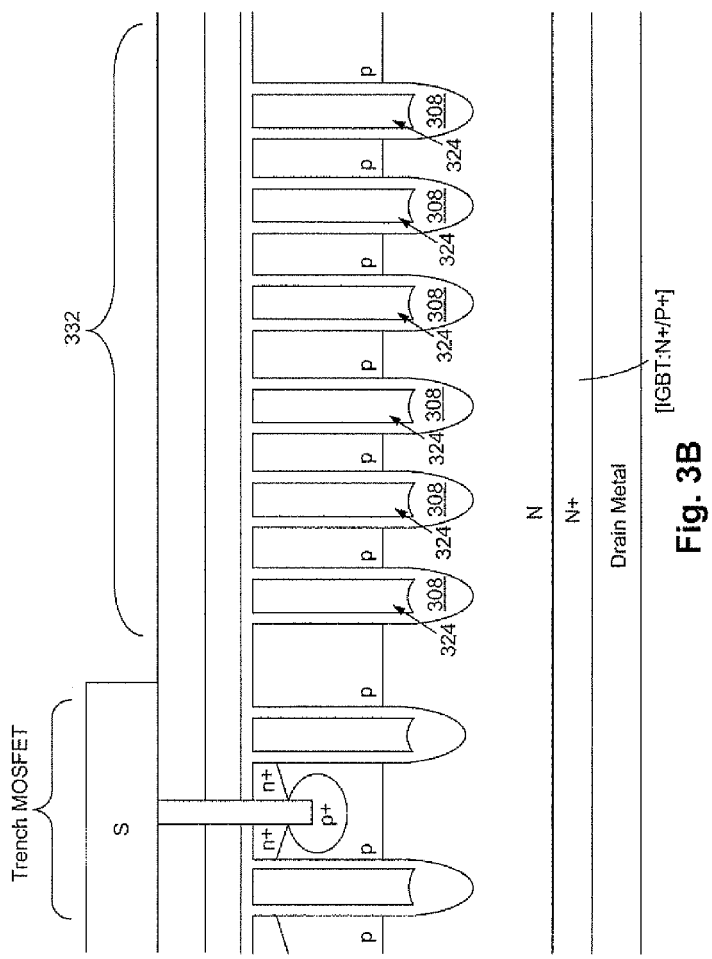
FIG. 3B is a cross-section view showing a termination area of another preferred embodiment for a semiconductor power device according to the present invention.

FIG. 3B shows the termination area 332 of the trench MOSFET of FIG. 3A, wherein the gate insulation layer 308 has a greater thickness along the bottoms than along the sidewalls of the third type trenched gates 324.

Figure 4A:
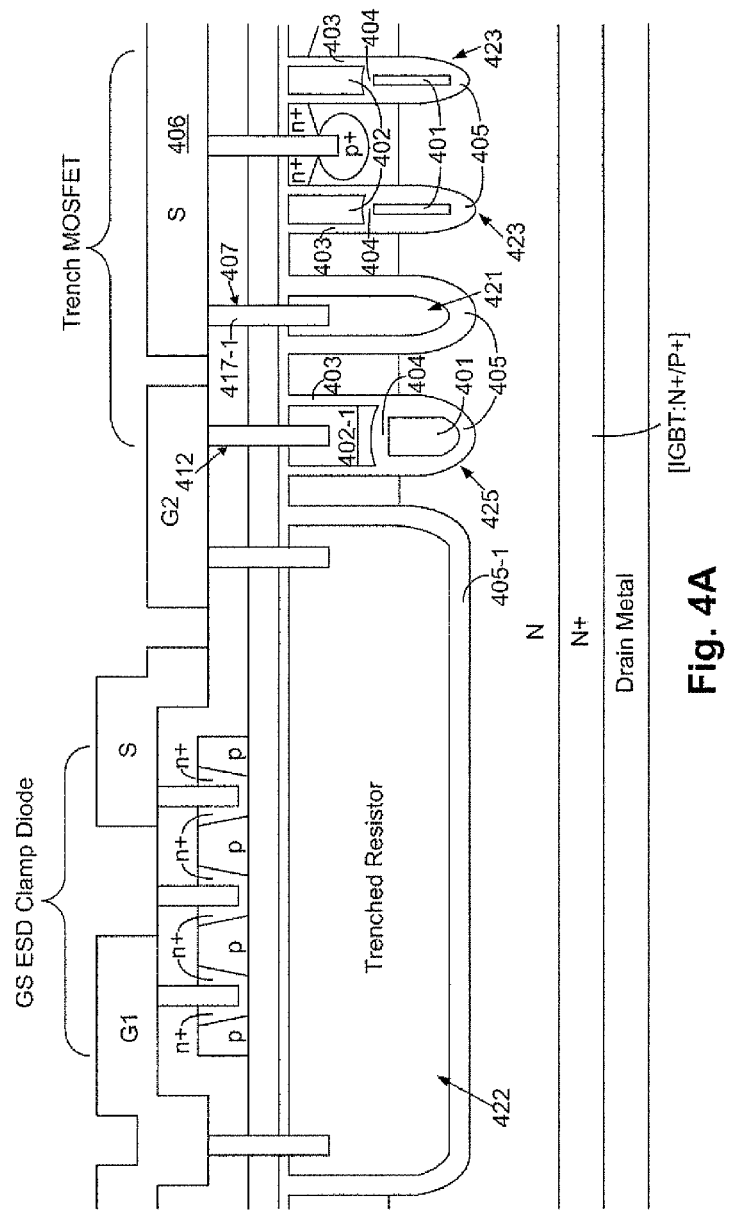
FIG. 4A is a cross-section view of another preferred embodiment for a semiconductor power device according to the present invention.

Please refer to FIG. 4A for another preferred embodiment of this invention. The structure of FIG. 4A is similar to the structure of FIG. 2A except that, in FIG. 4A, each of the first type trenched gates 423 has a shielded gate structure comprising a shielded electrode 401 in a lower portion and a gate electrode 402 in an upper portion, wherein sidewalls and a bottom of the shielded electrode 401 are surrounded by a first gate insulation layer 405, sidewalls of the gate electrode 402 are surrounded by a second gate insulation layer 403, wherein the first gate insulation layer 405 has a greater thickness than the second gate insulation layer 403, and the shielded electrode 401 and the gate electrode 402 are insulated from each other by an inter-insulation layer 404. The shielded electrode 401 is connected to the source metal layer 406 via a trenched shielded electrode contact 407 filled with a contact metal plug 417-1 (for example a tungsten plug padded by a barrier layer of Ti/TiN or Co/TiN or Ta/TiN) which extends into a fourth type trenched gate 421 having the single gate structure and comprising a single shielded electrode padded by the first gate insulation layer 405, wherein the single shielded electrode is formed at the same step as the shielded electrode 401. Moreover, the trenched gate contact 412 filled with the contact metal plug 471-2, which is the same as the contact metal plug 417-1, is extending into the gate electrode 402-1 of the second type trenched gate 425 which has the same shielded gate structure with the first type trenched gates 423. Another difference between the structure of FIG. 4A and FIG. 2A is that, in FIG. 4A, the resistor insulation layer 405-1 of the trenched resistor 422 has a greater thickness than the resistor insulation layer 208-1 in FIG. 2A.

Figure 4B:
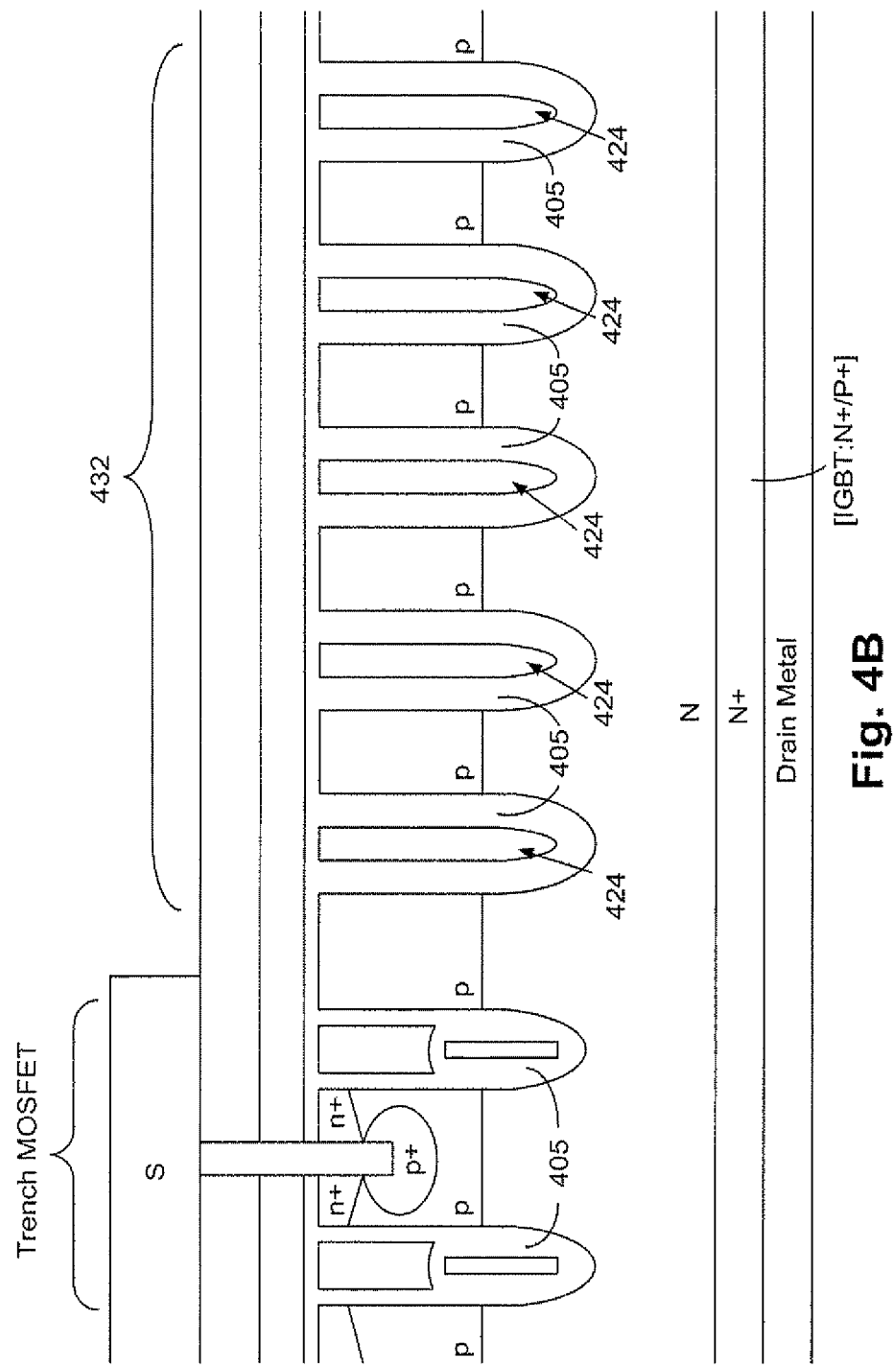
FIG. 4B is a cross-section view showing a termination area of another preferred embodiment for a semiconductor power device according to the present invention.

FIG. 4B shows the termination area 432 of the trench MOSFET of FIG. 4A. The termination area 432 has a similar structure to the termination area 223 of FIG. 2C except that, in FIG. 4B, each of the third type trenched gates 424 is lined by the first gate insulation layer 405 which has a greater thickness than the gate insulation layer 208 in FIG. 2C.

Figure 5:
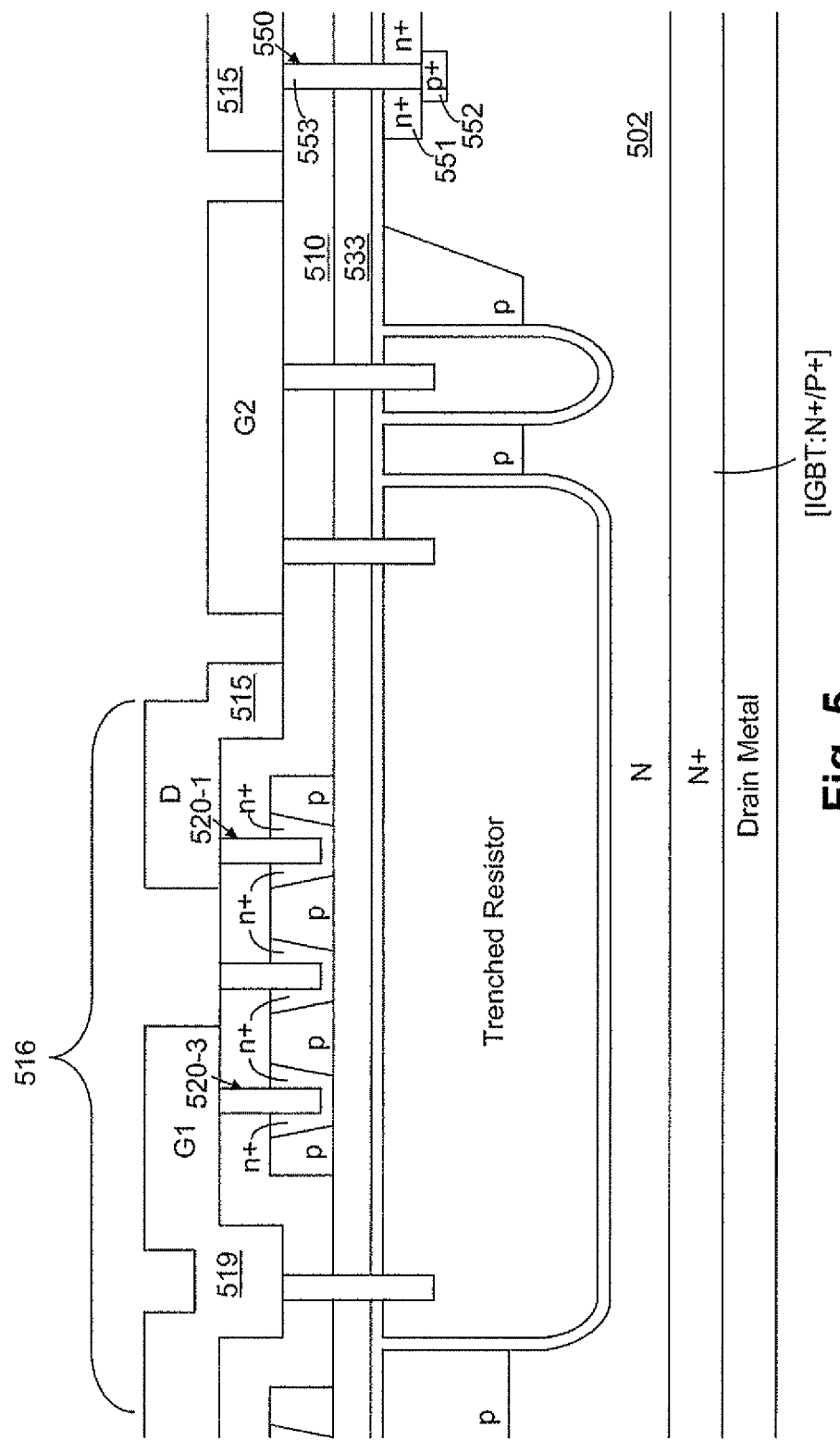
FIG. 5 is a cross-section view of another preferred embodiment for a semiconductor power device according to the present invention.

Please refer to FIG. 5 for another preferred embodiment of this invention which discloses a trench MOSFET integrated with a Gate-Drain clamp diode 516 between a gate region and a first drain region formed in a termination area for avalanche capability improvement. Therefore, in FIG. 5, the trenched diode contact 520-3 on one side (an anode side) of the clamp diode 516 is connected to a first gate metal layer 519 and the trenched diode contact 520-1 on another side (an cathode side) of the clamp diode 516 is connected to a front side drain metal layer 515 instead of to the source metal layer in FIG. 2A, wherein the front side drain metal layer 515 is finally connected to a drain region in the N epitaxial layer 502 via a trenched drain contact 550 penetrating through the contact interlayer 510, the thick insulation layer 533, an n+ contact region 551 and extending into the N epitaxial layer 502 with a p+ body contact area 552 around its bottom, wherein the n+ contact region 551 can reduce the contact resistance between the N epitaxial layer 502 and the contact metal plug 553 filled in the trenched drain contact 550. A second drain metal is formed on backside of the semiconductor layer.

Figure 6:
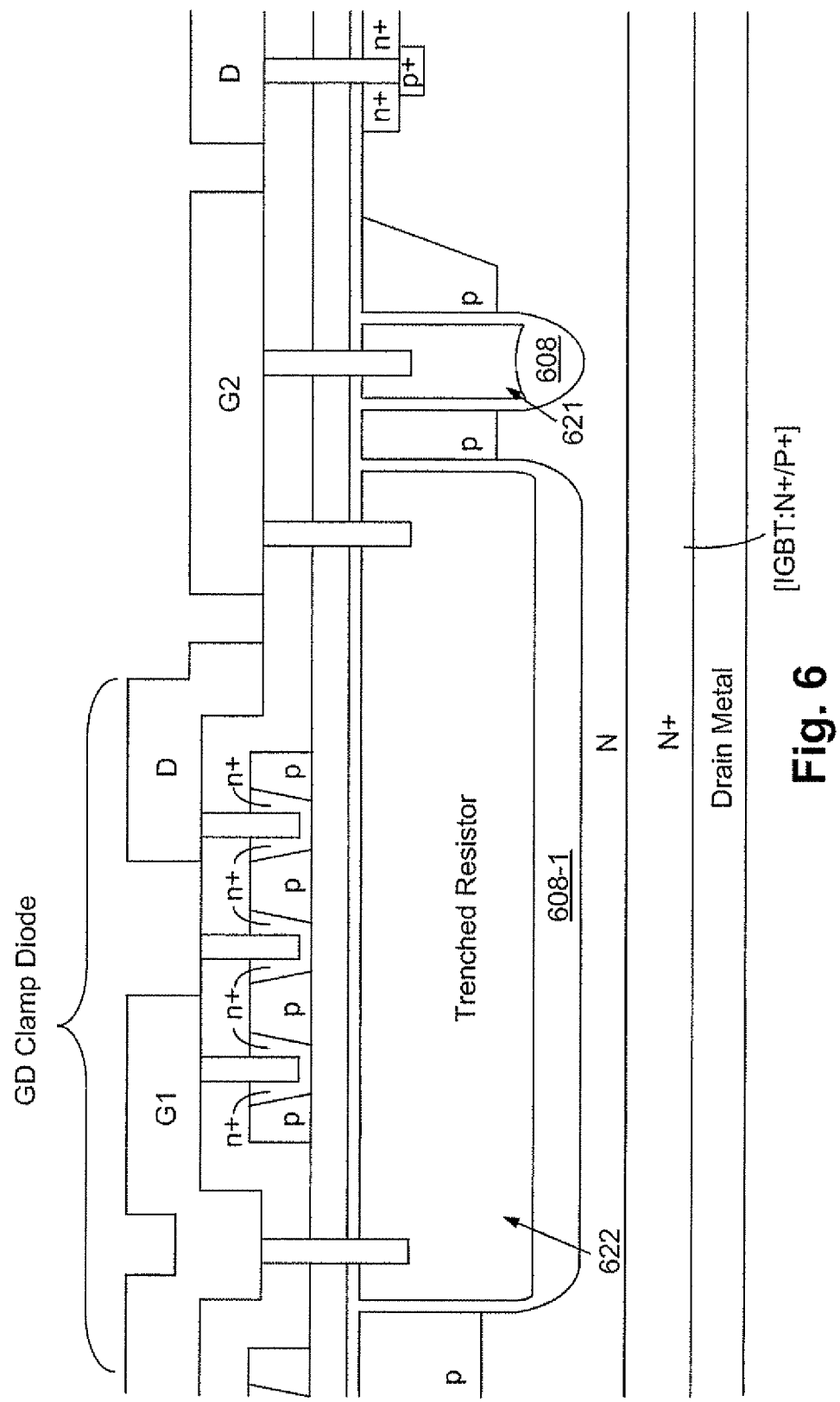
FIG. 6 is a cross-section view of another preferred embodiment for a semiconductor power device according to the present invention.

Please refer to FIG. 6 for another preferred embodiment of this invention. The structure of FIG. 6 is similar to the structure of FIG. 5 except that, in FIG. 6, the gate insulation layer 608 has a greater thickness along the bottom than along sidewalls of the second type trenched gate 621, the resistor insulation layer 608-1 has a greater thickness along the bottom than along the sidewalls of the trenched resistor 622.

Figure 7:
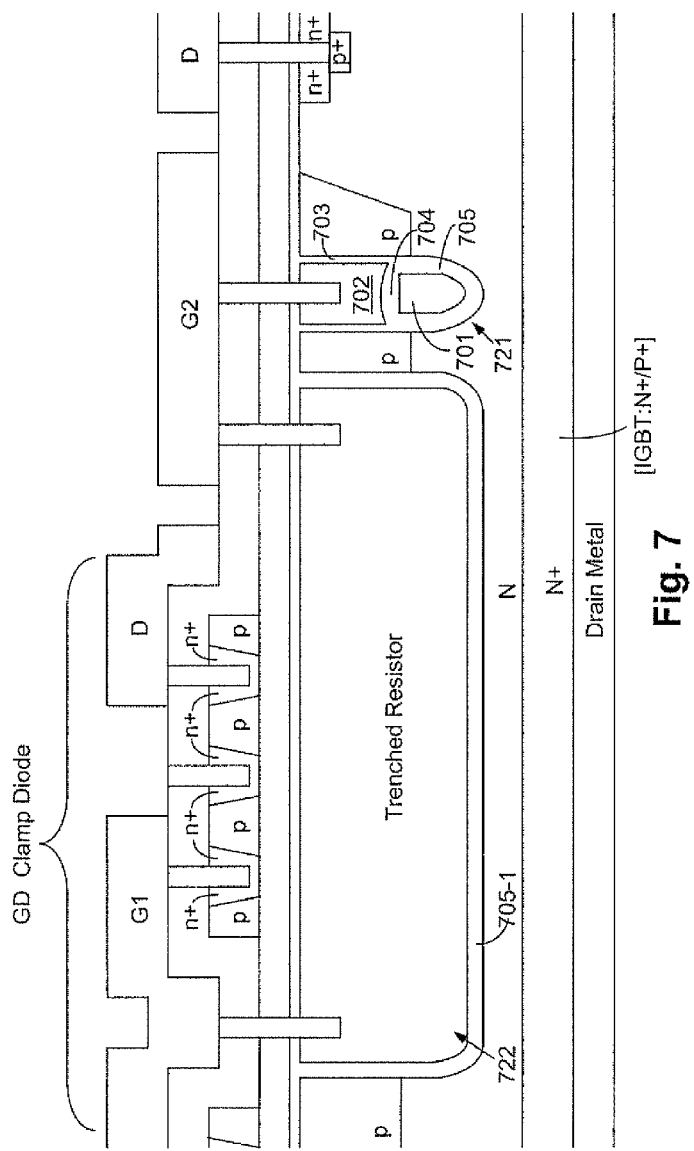
FIG. 7 is a cross-section view of another preferred embodiment for a semiconductor power device according to the present invention.

Please refer to FIG. 7 for another preferred embodiment of this invention. The structure of FIG. 7 is similar to the structure of FIG. 5 except that, in FIG. 7, the second type trenched gate 721 has a shielded gate structure comprising a shielded electrode 701 in a lower portion and a gate electrode 702 in an upper portion, wherein sidewalls and a bottom of the shielded electrode 701 are surrounded by a first gate insulation layer 705, sidewalls of the gate electrode 702 are surrounded by a second gate insulation layer 703, wherein the first gate insulation layer 705 has a greater thickness than the second gate insulation layer 703, the shielded electrode 701 and the gate electrode 702 are insulated from each other by an inter-insulation layer 704. The first type trenched gates (not shown) surrounded by the source regions have a same shielded gate structure as the second type trenched gate 721. Another difference between the structure of FIG. 7 and FIG. 5 is that, in FIG. 7, the trenched resistor 722 is lined by the first gate insulation layer 705-1 which has a greater thickness than the gate insulation layer in FIG. 5.

As an alternative to the exemplary embodiment illustrated and described above, the semiconductor power device can also be formed as a trench MST. In the case of a trench IGBT, the heavily doped N+ substrate should be replaced by an N+ buffer layer extending over a heavily doped P+ substrate. In this regards, the terminology, such as "source", "body", "drain" should be accordingly replaced by "emitter", "base", "collector".

Figure 8A:
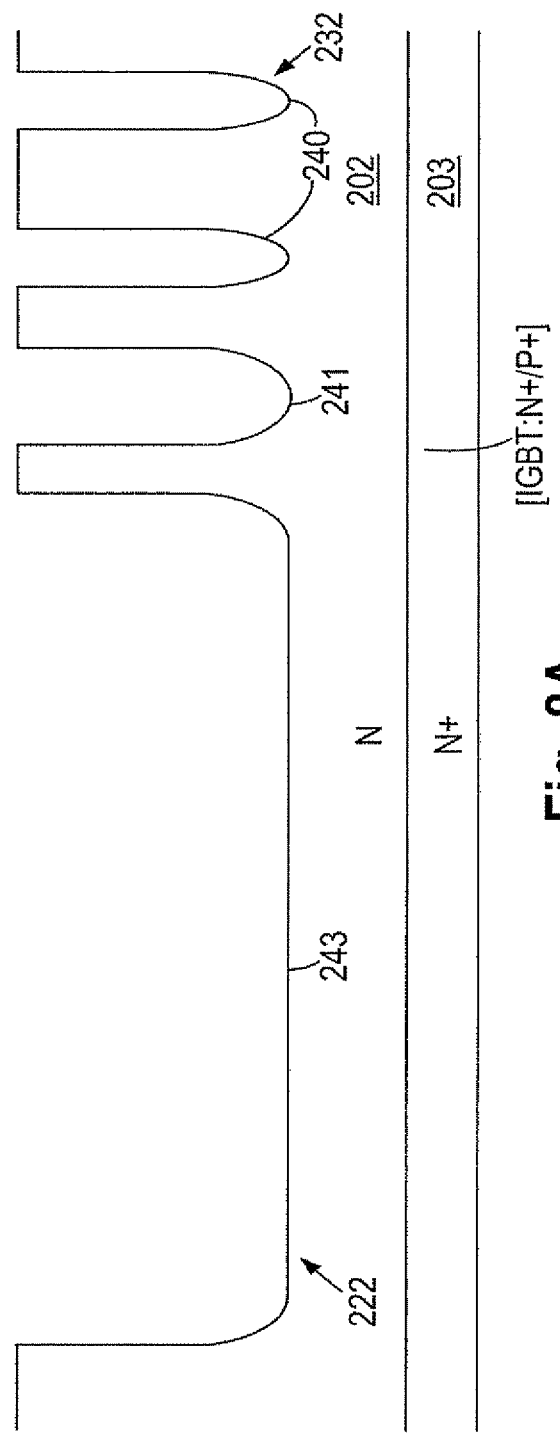
FIGS. 8A to 8F are a serial of side cross-sectional views for showing the process steps for manufacturing a semiconductor power device as shown in FIG. 2A.
Figure 8B:
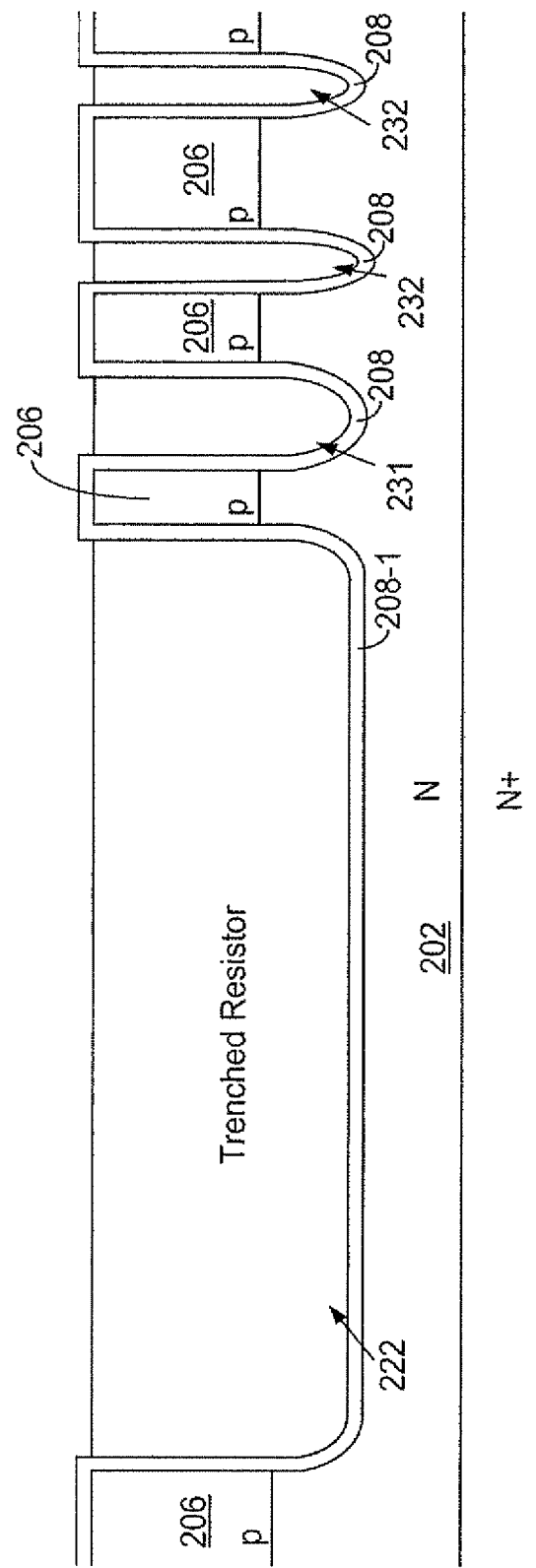
Figure 8C:
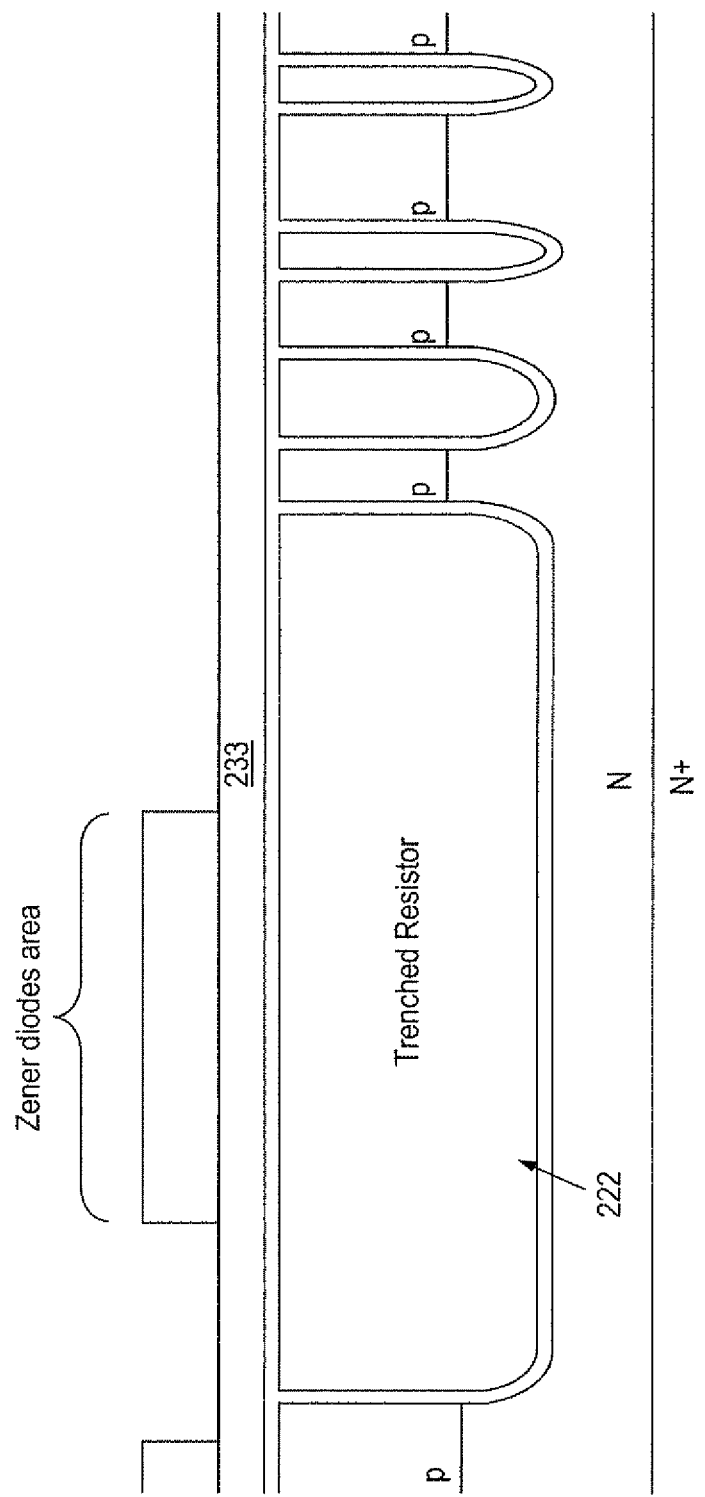
Figure 8D:
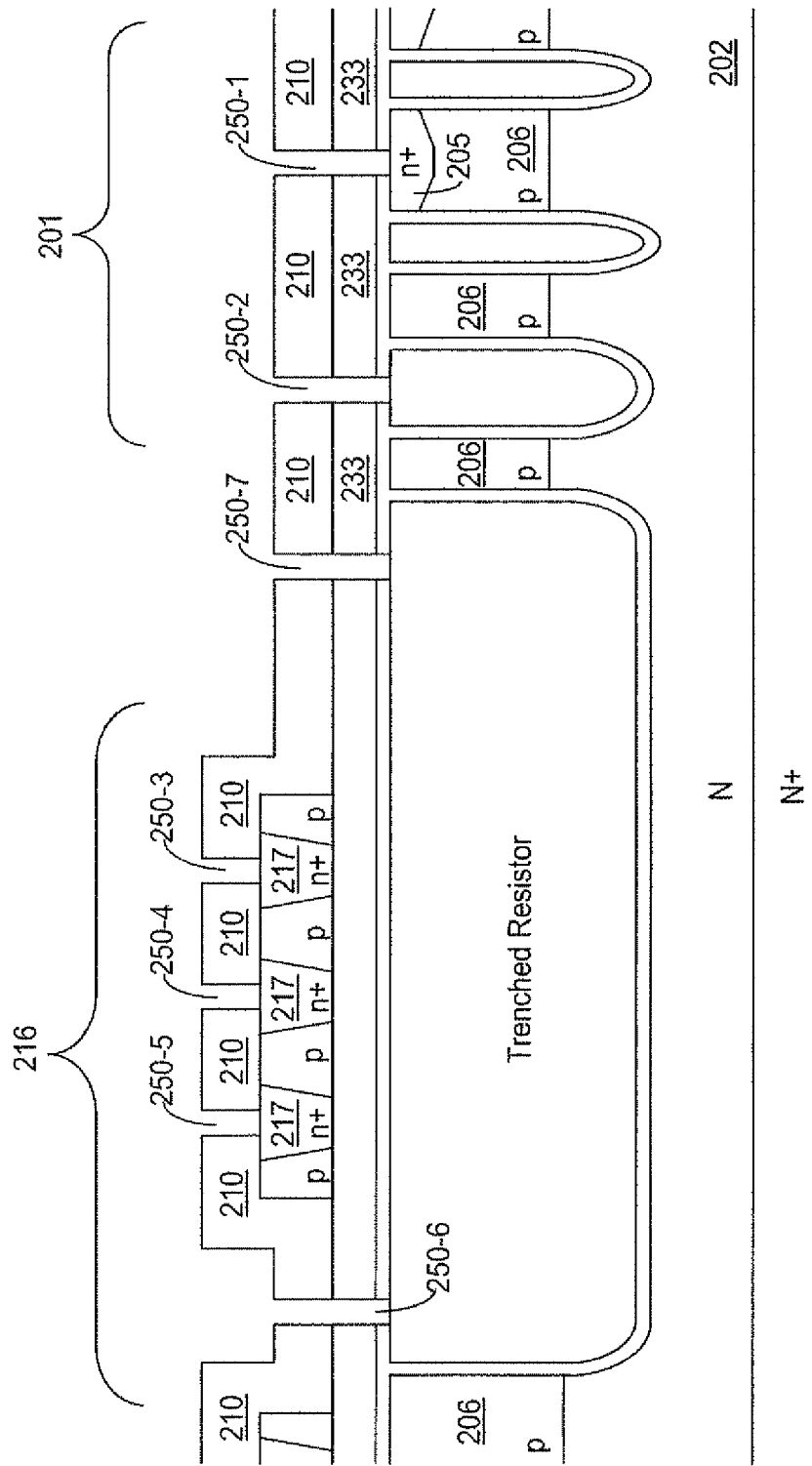
Figure 8E:
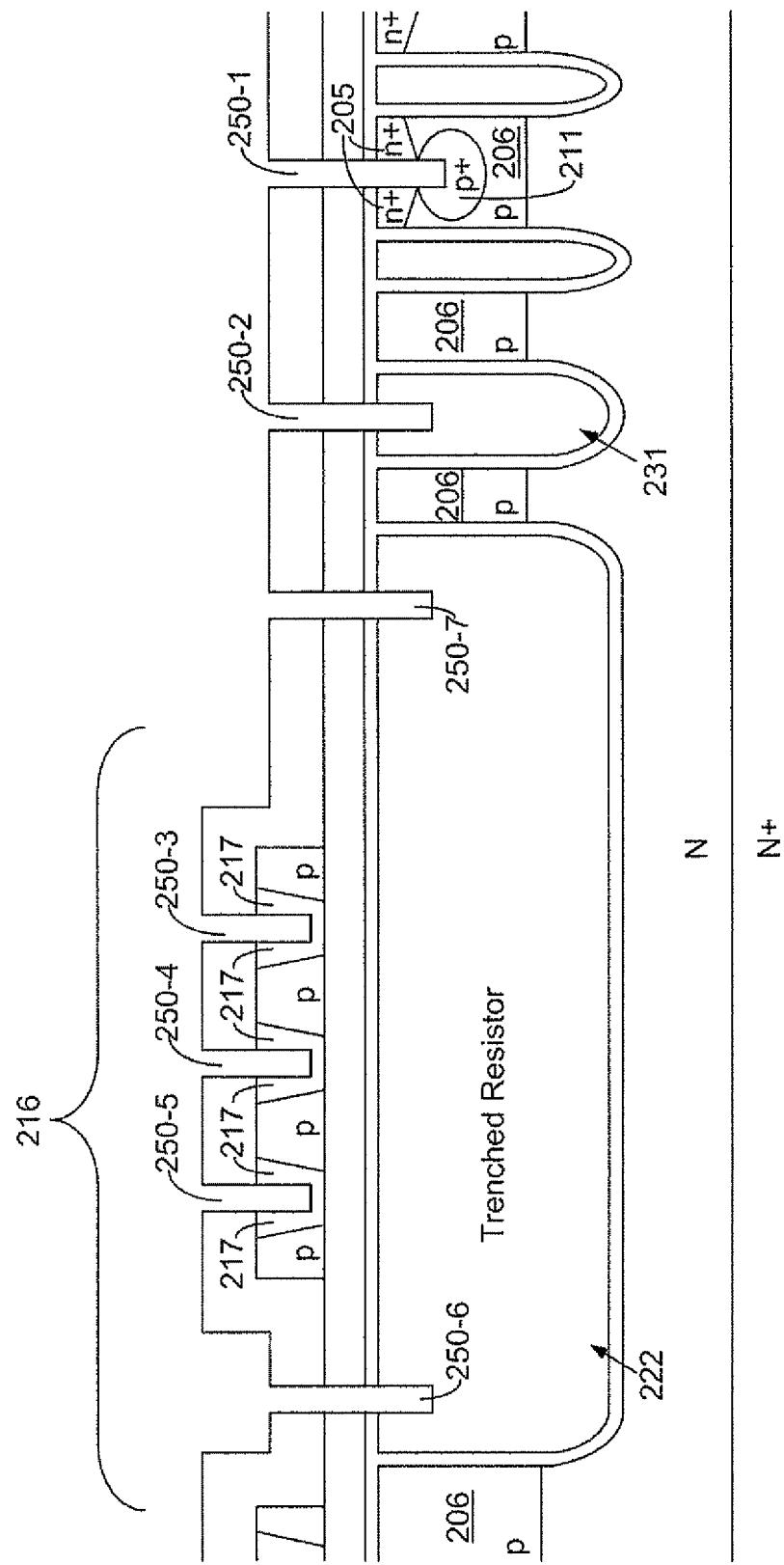
Figure 8F:
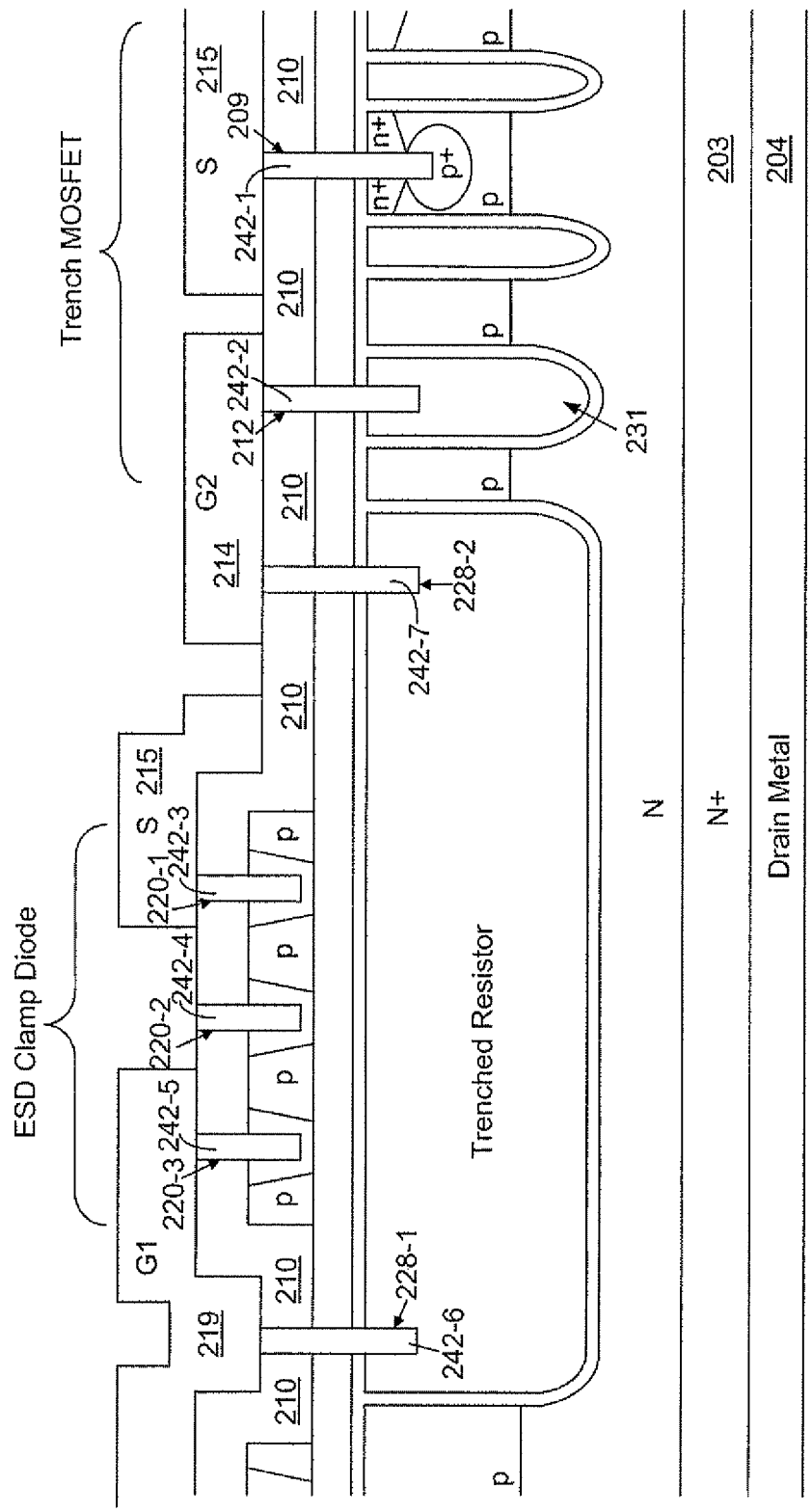

FIGS. 8A to 8F show a process of manufacturing the semiconductor power device as shown in FIG. 2A. Referring to FIG. 8A, an N epitaxial layer 202 is initially grown on a heavily doped N+ substrate 203. In the case of a trench IGBT, the N epitaxial layer is initially grown on an N+ buffer layer over a heavily doped P+ substrate. Next, a trench mask (not shown) is applied and followed by a trench etching process to define a plurality of gate trenches in the N epitaxial layer 202, including: a plurality of first type gate trenches 240, a second type gate trench 241 having a greater trench width than the gate trenches 240 for gate connection and a wide gate trench 243. Then, a sacrificial oxide layer (not shown) is grown and etched to remove the plasma damaged silicon layer formed during the process of opening the gate trenches. In FIG. 8B, an oxide layer is deposited or grown along an inner surface of all the gate trenches and along a top surface of the N epitaxial layer 202 to function as a gate insulation layer 208 and a resistor insulation layer 208-1. Then, a doped poly-silicon layer is filled into all gate trenches and followed by a poly-silicon CMP (Chemical Mechanical Polishing) or a dry etching back process to leave the poly-silicon layer within the gate trenches to form a plurality first type trenched gates 232, the second type trenched gate 231 and the trenched resistor 222, respectively. Thereafter, after carrying out a p dopant ion implantation step and a successive diffusion step, a plurality of p body regions 206 are formed in an upper portion of the N epitaxial layer 202 without a p body mask. In FIG. 8C, a thick insulation layer 233 with a thickness greater than 1000 angstroms is deposited on a top surface of the structure of FIG. 8B. Then, an un-doped poly-silicon layer is deposited onto the thick insulation layer 233 and then followed by a blank boron ion implantation process. Afterwards, a clamp diode mask (not shown) is applied on the un-doped poly-silicon layer and followed by a dry poly-silicon etching process to define the Gate-Source clamp diode area (as illustrated in FIG. 8C) over the trenched resistor 222. In FIG. 8D, a contact interlayer 210 is deposited on a top surface of the structure of FIG. 8C. Then, a contact mask (not shown) is employed and then followed by a dry oxide etching process to define a plurality of contact open areas for trenched contacts (250-1~250-7) to expose a part top surface of the clamp diode and a part top surface of the N epitaxial layer 202 for a followed n dopant ion implantation step and a diffusion step after which there form n+ source regions 205 near a top surface of the p body region 206 in an active area of the trench MOSFET 201 and a plurality of n+ doped regions 217 for the clamp diode 216 without a source mask. In FIG. 8E, after a dry silicon etching process, the contact holes (250-1~250-7) are respectively etched to be extending into the n+ doped regions 217 of the clamp diode 216, into the doped poly-silicon layer of the trenched resistor 222 and into the second type trenched gate 231, and into the p body region 206 after penetrating through the n+ source regions 205. Next, after carrying out a BF2 ion implantation and a step of RTA (Rapid Thermal Annealing) process, a p+ body contact region 211 is formed underneath the n+ source regions 205 and surrounding a bottom of the contact hole 250-1 which is extending into the p body region 206. In FIG. 8F, a barrier layer Ti/TiN or Co/TiN or Ta/TiN is deposited on sidewalls and bottoms of all the contact trenches (as shown in FIG. 8E) followed by a step of RTA process for silicide formation. Then, a tungsten material layer is deposited onto the barrier layer, wherein the tungsten material layer and the barrier layer are then etched back to form contact metal plugs (242-1~242-7) respectively for: a trenched source-body contact 209; a trenched gate contact 212; trenched contacts 220-1~220-3; and trenched metal contacts 228-1~228-2. Then, a metal layer of Al alloys or Cu padded by a resistance-reduction layer Ti or Ti/TiN underneath is deposited onto the contact interlayer 210 and followed by a metal etching process by employing a metal mask (not shown) to form a first gate metal layer 219, a second gate metal layer 214 and a source metal layer 215. Last, a back metal layer of Ti/Ni/Ag is deposited onto a bottom side of the N+ substrate 203 as a backside drain metal layer 204 after grinding. As an alternative to the exemplary embodiment illustrated, the thick insulation layer 233 except the Gate-Source clamp diode area, is removed by dry or wet etch prior to depositing the contact interlayer.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench semiconductor power device integrated with a Gate-Source clamp diode for ESD protection, wherein:
   said trench semiconductor power device comprising:
   a plurality of first type trenched gates formed in a semiconductor silicon layer;
   source regions of a first conductivity type encompassed in body regions of a second conductivity type between two adjacent of said first type trenched gates, said source regions being connected to a source metal layer of said trench semiconductor power device;
   said Gate-Source clamp diode comprising:
   multiple back to back poly-silicon Zener diodes with alternating doped regions of said first conductivity type next to said second conductivity type;
   a plurality of trenched Gate-Source clamp diode contacts extending into all of said doped regions of said first conductivity type of said Gate-Source diode, and each being filled with a contact metal plug padded by a barrier metal layer; and
   said Gate-Source clamp diode being connected to a first gate metal layer on one side, and connected to said source metal layer on another side; wherein
   said first gate metal layer acting as a gate metal pad for gate metal bonding is connected to a second gate metal layer through a trenched resistor formed in said semiconductor silicon layer and partially disposed below said back to back poly-silicon Zener diodes, wherein said second gate metal layer is connected to at least a second type trenched gate having wider trench width than said first type trenched gates, and extending to said first type trenched gates for gate connection through a trenched gate contact filled with said contact metal plug in said second type trenched gate.

2. The trench semiconductor power device of claim 1, wherein said contact metal plug is Tungsten (W).

3. The trench semiconductor power device of claim 1, wherein said barrier metal layer is Ti/TiN, Co/TiN, or Ta/TiN.

4. The trench semiconductor power device of claim further comprising:
   a plurality of trenched source-body contacts each filled with said contact metal plug penetrating through said source regions and extending into said body regions between two adjacent of said first type trenched gates; and said source regions having a doping concentration along trench sidewalls of said trenched source-body contacts higher than along a channel region near an adjacent first type trenched gate at a same distance from a top surface of said semiconductor silicon layer, and said source regions have a junction depth along the trench sidewalls of said trenched source-body contacts greater than along said channel region, and said source regions have a doping profile of a Gaussian-distribution along the top surface of said semiconductor silicon layer from the trench sidewalls of said trenched source-body contacts to said channel region.

5. The trench semiconductor power device of claim 1, wherein each of said first type trenched gates is a single gate electrode padded by a gate insulating layer having a thickness along bottoms of said first type trenched gates not greater than along sidewalls of said first type trenched gates.

* * * * *